United States Patent [19]

Dorfeld et al.

[11] 4,166,917
[45] Sep. 4, 1979

[54] CONCENTRATING SOLAR RECEIVER

[75] Inventors: William G. Dorfeld, Lindley, N.Y.; Ugur Ortabasi, San Juan, P.R.

[73] Assignee: Corning Glass Works, Corning, N.Y.

[21] Appl. No.: 907,946

[22] Filed: May 22, 1978

[51] Int. Cl.² ............................................. H01L 31/04
[52] U.S. Cl. ........................... 136/89 CA; 136/89 HY; 136/206; 126/438; 165/105
[58] Field of Search ............ 136/89 PC, 89 HY, 89 H, 136/89 CC, 206; 126/270, 271; 250/239

[56] References Cited

U.S. PATENT DOCUMENTS

| 3,899,672 | 8/1975 | Levi-Setti | 350/293 |
| 3,990,914 | 11/1976 | Weinstein et al. | 136/89 |
| 4,045,246 | 8/1977 | Mlavsky et al. | 136/89 PC |
| 4,069,812 | 1/1978 | O'Neill | 126/271 |
| 4,078,944 | 3/1978 | Mlavsky | 136/89 H |
| 4,084,576 | 4/1978 | Pei | 126/270 |
| 4,088,121 | 5/1978 | Lapeyre | 126/271 |

FOREIGN PATENT DOCUMENTS

| 695028 | 8/1940 | Fed. Rep. of Germany | 136/89 |
| 517755 | 7/1976 | U.S.S.R. | 126/271 |

Primary Examiner—Aaron Weisstuch
Attorney, Agent, or Firm—John P. DeLuca; Burton R. Turner

[57] ABSTRACT

There has been provided a concentrating solar receiver of the type including a closed envelope having a window and reflective portions. A photocell is disposed at a focal zone for the reflector. Heat and/or electricity may be produced from received solar energy and the envelope is manufactured in the configuration of a specially formed bulb preferably having a thin wall glass structure.

17 Claims, 5 Drawing Figures

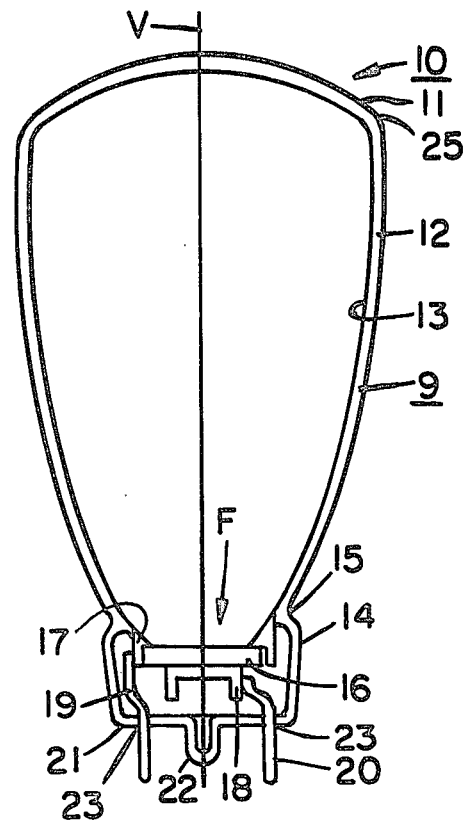
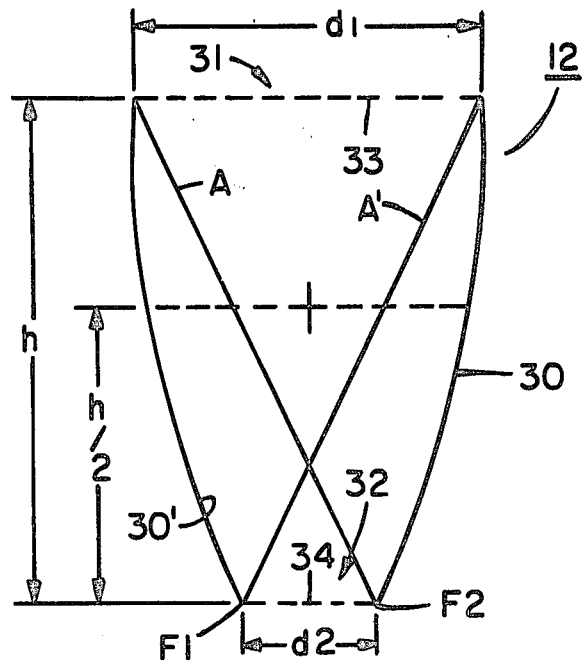
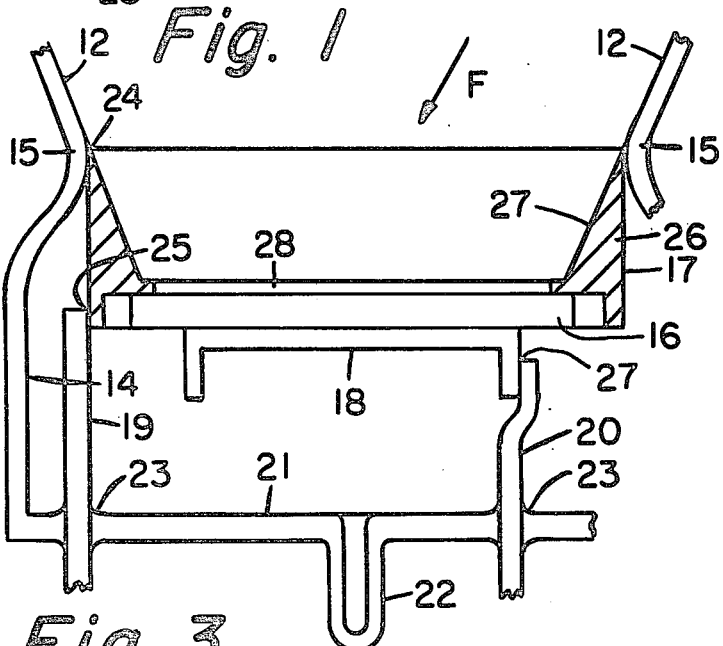
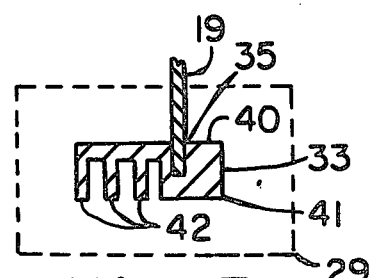
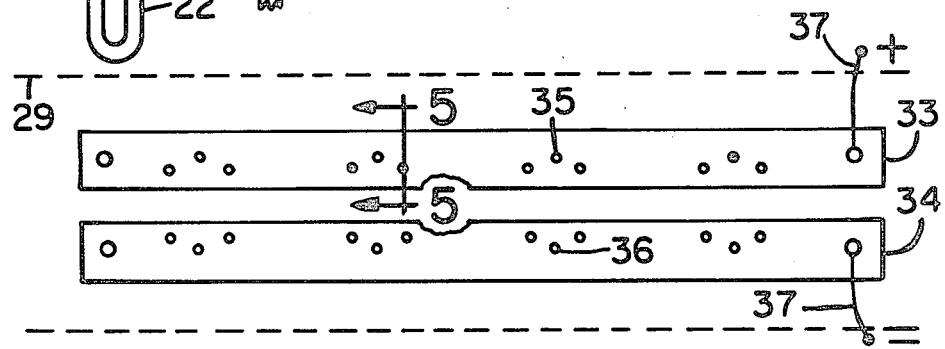

CONCENTRATING SOLAR RECEIVER

BACKGROUND OF INVENTION

The invention relates to a concentrating solar receiver and more particularly to a solar receiver of the type which may remain in a fixed orientation relative to a portion of the sky. That is, the receiver does not necessarily track the sun continuously through the day although the receiver or group of receivers may be moved during the solar day if it is required by receiver geometry. Periodic adjustments are usually made during the solar year to compensate for changes in the relative path of the sun across the sky, e.g., summer and winter solstice and equinox.

The receiver is adapted to produce electrical and/or thermal energy from resultant exposure to solar radiation. The receiver, in a preferred form, has as a major component a blown glass envelope formed in a manner similar to a light bulb manufacture. The envelope has a concentrating mirror and a photosensitive element or solar cell and/or a heat absorber disposed in a focal zone for the said concentrating mirror.

The invention provides for concentration of sunlight onto the solar cell of appropriate kind (silicon, CdS, etc.) thereby increasing its output. The cell is preferably encapsulated within the envelope. Thermal and electrical energy is removed by appropriate energy conductors.

Previous attempts to produce solar receivers capable of producing electrical power have been hampered by the high cost of photocells and complex technology necessary to manufacture the cells. New techniques however have been developed for producing photocells (e.g., edge defined film growth, dendritic growth, rolled silicon or sheets of cast silica that are recrystallized through heat or molten zones). See for example the publication Proceedings of the ERDA Semiannual Solar Photovoltaic Program review NTIS #Conf. 760837-PZ illustrating such techniques.

The solar cell has been adapted for use in outer space and is effective notwithstanding its rather low efficiency. The use of such devices in space is justified since they are ideally suited for the application. However, their use in domestic solar energy application requires greater utilization (i.e., higher efficiency, per square foot of cell material used and lower cost for each cell). Newer cells, particularly those produced of GaAs exhibit higher efficiency (in the order of 20%) which may offset its higher cost. Concentration of solar energy on the cell increases its output which in turn reduces the effective cost per square foot.

In order to be most effective a solar cell must be cooled. The lower the temperature the more efficient the production of electrical output. In space, radiation cooling is effective to protect the cell. Terrestrial use, on the other hand, is well served by capturing heat produced in the cell for secondary thermal production. Such applications known as hybrid systems produce thermal as well as electrical energy.

In a preferred embodiment the cell is encapsulated in a glass envelope, although it is envisioned that a cell external of the envelope may be appropriately bonded thereto. The glass envelope will protect the cell from the ambient. The envelope should be provided with a reflector surface, which is effective to multiply the effective area of the cell by the concentration ratio of the envelope including the reflector surface.

Variations of the invention and its hybrid application to electrical and thermal energy production will be discussed in the description of the various embodiments.

SUMMARY OF THE INVENTION

There has been provided a concentrating solar receiver responsive to impinging solar radiation for converting same to other useful forms of energy. An enclosed envelope having a solar window is adapted to be oriented towards the sun. A reflector portion integral with the window supports a reflector surface downstream of the window and the reflector portion concentrates said solar radiation towards a focal zone. An energy absorber is disposed in the focal zone and intercepts the concentrated radiation while conduction means carries energy converted by the absorber away therefrom. The envelope is sealed against the ambient and may enclose a gas atmosphere of varying degree of partial pressure.

DESCRIPTION OF THE DRAWINGS

FIG. 1 is a side sectional elevation of the solar receiver of the present invention.

FIG. 2 is a graphic representation of the preferred geometry of the concentrating surface of the solar receiver of the present invention.

FIG. 3 is a fragmental detail in side section of a photocell adapted for use in the receiver including pin connections and means for coupling the cell to the envelope, which detail is taken from a lower portion of FIG. 2.

FIG. 4 is a top elevation of a bus bar for coupling one or more solar receivers of the present invention to a thermal and/or electrical circuit.

FIG. 5 is a cross section of one bus-bar of FIG. 4 taken along line 5—5 thereof.

DESCRIPTION OF THE PREFERRED EMBODIMENTS

In FIG. 1 there is illustrated a side sectional view of a concentrating solar receiver 10 of the type contemplated by the present invention. The receiver 10 employs a structure including a window 11 which is essentially transparent to solar radiation and an integral reflector or concentrating portion 12, which has a profile which is symmetrical about a vertical axis —V— illustrated in the drawing. The concentrating portion 12 has a reflector or mirrored surface 13 which may be applied by flashing a shaped evaporation source on the concentrating portion 12 according to known techniques. The structure of the receiver 10 has a neck portion 14 which is coupled to a lower end 15 of the concentrating portion 12 and extends downwardly in the drawing.

A solar cell 16 is mounted within the body of the receiver 10 in a focal zone F for the receiver 10 as will be explained further in the description. The solar cell 16 is supported by upper and lower support rings 17 and 18 respectively, which are fashioned from some conductive material capable of removing electrical energy produced by insolation of the solar cell 16. The upper and lower support rings 17 and 18 are respectively coupled to pins 19-20, only two of which are shown, which pins act as conductors for the electrical energy from the conductive support rings 17-18. Further the pins 19 and 20 and support rings 16 and 17 may also act as thermal conductors for removal of heat which results from the insolation of the solar cell 16. The removal of heat is important in order to render the cell 16 more efficient since it operates more favorably at lower temperatures. The pins 19–20 are supported in a glass stem 21, which stem has an integral evacuation and refill port 22. Each of the pins 19 and 20 are formed with glass-to-metal seals 23 by known techniques in the bulb manufacturing art.

FIG. 2 illustrates the geometry of the concentrating portion 12 of the structure 10 illustrated in FIG. 1. The concentrating portion 12 takes the shape of parabolic curve 30 which has as its focus a point F1 located at a lower edge of an opposite curve 30' of similar shape having focus F2 at the lower edge of curve 30. The curve 30 has an axis A passing through focus F2 and making a angle $\theta$ with an optical axis OA for the given geometry. The geometry of the curve 30 has been described for a trough by Winston in U.S. Pat. No. 3,923,381. In the particular embodiment of the present invention illustrated, the curve 30 is rotated about the optical axis OA through 360° in the horizontal to form a profile as illustrated. The surface formed has a circular cross section when viewed from the vertical with respective upper and lower diameters d1 and d2 defining respective entrance and exit apertures 31 and 32, at respective upper and lower margins 33 and 34. It has been determined that the concentration ratio for a concentrating receiver is a function of the ratio of the area of entrance aperture 31 to the area of the entrance aperture 32 which is proportioned to the ratio of d1/d2. For a concentrating receiver defined by Winston in the aforementioned patent, the ratio of d1/d2 equals the sine of the angle defining the field of view (or angle of acceptance of the concentrating section 12). In the present invention the angle $\theta$ formed by the optical axis OA and the parabola axis A (or $\theta$ and A' for a geometrical surface) equals half the field of view. In the present invention a ratio d1/d2 may be equated to sine $\theta$ for a preferred geometry illustrated in which angle $\theta$ equals ½ angle of acceptance for the concentrating section 12. The concentrating section 12 has a height which is derived from the geometry of FIG. 2. The maximum vertical height h for a surface described by Winston and modified for use in the present invention is established when the curve 30 at upper margin 33 is parallel to optical axis OA. For economy of materials a smaller surface may be produced. To this end a truncation line has been established at h/2 which for a selected angle of acceptance $\theta$ reduces the concentration ratio by some minimal amount. The reason for using the truncational line at h/2 to determine the height of the envelope is to reduce the amount of material necessary to produce the concentrating solar receiver and also simplify the glass mold. It has been found for example that for an angle of acceptance $\theta$ of 19.47° a concentration ratio of 3 may be established. If the concentrator is truncated by half that is at h/2 the concentration ratio drops to about 2.7. This has been envisioned as a satisfactory tradeoff in terms of the reduced materials and simpler molds. Other variations are possible as required.

FIG. 3 illustrates in fragmental size cross section an enlarged and detailed view of the solar cell 16 and pertinent structures illustrated in FIG. 1. The solar cell 16 may be a circular disc of cast or fused silicon, CdS, or other suitable material which includes the conductive lower support ring 18 in the form of an inverted cup and conductive upper support ring 17 which includes an upstanding portion 26 in the form of a conical surface 27 which acts as a secondary reflecting and concentrating portion. In the drawing a fragmented portion of the neck 14 mates with an upper portion 24 of the upper ring 17 at a lower portion 15 of the concentrating portion 12 when the neck portion 14 meets reflector portion 12. The conical surface 27 prevents the loss of scattered radiation in the vicinity of the focal zone F for the receiver 10. Current conducting fingers 28 carry electrical energy produced by insolation of the solar cell 16 to the upper ring 17 which is suitably coupled to the pin 19 at weld 25. Similarly the lower support ring 18 is coupled to the lower portion of the cell 16 and it in turn is coupled to pin 20 at weld 27. It should be realized that a plurality of the pins 19 and 20 may be provided for more efficient thermal energy conduction as will be explained relative to FIGS. 4 and 5 below.

A bus bar arrangement 33 and 34 is illustrated in FIG. 4 wherein one bar 33 acts as a positive terminal and the other bar 34 acts as a negative terminal for receiving pins 19,20 in respective pin sockets 35 and 36. Power leads 37 carry power to an external circuit.

In FIG. 5 there is illustrated a section of bus bar 33 taken along line 5—5 of FIG. 4. In that Figure one of the pin sockets 35 is illustrated depending from an upper surface 40 of the bus bar 33, with pin 19 diposed therein. A lower surface 41 of the bus bar 33 has an extruded surface including depending fins 42, which conduct heat away from the pins 19. In the embodiment illustrated the bus bars 33 and 34 may be enclosed in a heat duct or conduit 29 as illustrated by the dotted lines, which conduit may carry a working fluid such as air which continually cools the fins 42. In this way, useful thermal as well as electrical energy is removed from the solar cell 16. Heated working fluid may be utilized for supplementary heating of space within a dwelling or may be used to heat a storage bin holding a suitable storage medium as is known in the art. The embodiment illustrated in the FIGS. 1-5 is what is known as a hybrid system which produces both electrical and thermal energy from one or more solar receivers. It should be understood that in certain situations one or the other of thermal and electrical energy may be usefully produced by the solar receiver 10 of the present invention.

Referring again to FIG. 1, the main body of receiver 10 is preferably a glass envelope 9 generally defined by transparent window 11, reflector or concentrating portion 12, neck 14 and seal 21. The envelope 9 may be filled with inert gas such as argon, helium or nitrogen to a partial pressure of about 1/10 torr to about 2,000 torr. On the other hand the envelope 9 may be partially evacuated in order to reduce conductive losses from the outer surface of the receiver 10 to ambient. In an electrical thermal hybrid system discussed above it is preferable to refill the envelope 9 with inert gas. In the hybrid mode the gas provides for some convective heat loss over the cell 16.

In a thermal system it is preferable to evacuate the envelope and substitute a thermal collector for the cell 16 so that heat losses are minimized and the thermal energy produced by the insolation of collector 10 is conducted via suitable heat conduction means such as pins 19–20 to working fluid in conduit 29 illustrated in FIGS. 4 and 5. The envelope 9 when used as a thermal collector may be evacuated to some relatively low pressure of about 350 Torr to about $10^{-6}$ Torr.

The solar window 11 may be coated or treated so as to have an anti-reflective surface which reduces the reflective losses from the insolation. In addition if a thermal collector is contemplated, the mirrored surface 13 and the window 11 may be provided with an infrared reflecting treatment so as to further reduce thermal losses.

The glass stem 21 illustrated in FIG. 1 includes the evacuation and refill port 22 as an integral member. The port 22 is utilized as is known in the glass industry for access to establish the atmosphere within the envelope.

It is possible to devise a thermal collector of the type envisioned in the present invention by providing an envelope 9 similar in most respects to that of the present invention of FIGS. 1-5 but with the substitution of a heat pipe therein in place of the cell 16, which heat pipe may have a thermal absorber surface and possibly an electrical solar cell deposited thereon. The heat pipe would have an evaporation zone in the vicinity of the focal zone F and a condensor zone exterior of the envelope 9 near the evacuation and refill port.

The workings of a heat pipe are known and are only generally described herein. The heat pipe might be constructed of a good electrical as well as thermal conductor such as copper and act as one electrode for an electrical solar cell such that the cell is cooled by the action of the heat pipe and simultaneously produces electrical energy. The heat pipe may be all glass and have an electrically conductive coating or may be used as only a thermal conductor. Electrical connections may be similar to that of FIG. 1 if desired.

It should be understood that the envelope 9 may be manufactured by light bulb fabrication techniques. The envelope 9 for the solar receiver 10 may be blown as an integral unit having thin walls, on the ribbon machine which will produce highly smooth internal surfaces such as concentrating portion 12 which may be silvered or mirrorized 13 and rendered highly reflective. Other methods are also possible but the ribbon machine is fast and produces good envelopes and may be adapted for the shape of a compound parabolic surface as described herein.

While there have been described what are presently considered to be the preferred embodiments of the present invention, it will be obvious to those skilled in the art, that various changes and modifications may be made therein without departing from the invention, and it is intended in the appended claims to cover all such changes and modifications as fall within the true spirit and scope of the invention.

What is claimed is:

1. A concentrating solar energy receiver responsive to impinging solar radiation for converting same to useful energy comprising: an integral enclosed envelope having a solar window adapted to be oriented toward the sun; a concentrating portion integral with said solar window; a reflector surface in communication with said concentrating portion downstream of said solar window for concentrating radiation impinging thereon, said reflector surface providing a focal zone wherein said reflected radiation is generally concentrated; absorber means disposed in said focal zone for intercepting and absorbing said concentrated radiation, including a photosensitive means for converting said radiant solar energy into an electrical current and a thermal absorber for absorbing radiation and converting said radiation into thermal energy, and energy conductive means coupled to said absorbing means for removing the electrical and thermal energy produced by said absorber means including at least one energy conductive lead in contact with each of opposed faces of said absorber means and at least one pin coupled to each lead adapted to sealably perforate a downstream end of said envelope, each lead and corresponding pin carrying electrical and thermal energy away from said cell, said envelope being sealed against ambient and enclosing an atmosphere of selected constituents under a selected partial pressure.

2. The concentrating solar receiver of claim 1 wherein said conductive means includes heat sink operatively attached to said absorber for conducting thermal energy away therefrom.

3. The concentrating solar receiver of claim 1 wherein said conductive means further includes a heat pipe including an evaporator portion located near the focal zone and a condenser portion spaced away therefrom for radiating heat so absorbed by the evaporative portion in said focal zone.

4. The concentrating solar receiver of claim 3 wherein said heat pipe includes: at least one photosensitive means disposed in contact with said evaporative zone, said photosensitive means capable of delivering an electrical current under said radiation and said conduction means includes electrical conductors coupled to said photosensitive means for carrying said electrical current so produced away from photocell upon electrical completion of the conductors and means including the condenser zone of the heat pipe to give up thermal energy absorbed in said evaporated zone.

5. The concentrating solar receiver of claim 1 wherein said atmosphere enclosed within the envelope is substantially inert and includes a gas selected from the group consisting essentially of argon, nitrogen, and helium.

6. The concentrating solar receiver of claim 5 wherein said inert atmosphere is enclosed at a partial pressure from about 1/10 Torr. to about 2000 Torr.

7. The concentrating solar receiver of claim 1 where said envelope encloses an evacuated atmosphere having a pressure of about 350 Torr to about $10^{-6}$ Torr.

8. The concentrating solar receiver of claim 1 wherein said reflector portion is a surface taking the form of a compound paraboloid.

9. The concentrating solar receiver of claim 8 wherein said compound paraboloid is a surface formed by rotation of a parabola about an optical axis, said parabola having a geometric axis intersecting the optical axis at a selected angle defining an angle of acceptance or half-field of view for the surface, and said geometric axis includes focus for an opposed curve line for the surface in axial cross section, the surface having entrance and exit apertures defined of areas of rotation of the parabola about the optical axis.

10. The concentrating solar receiver of claim 9 wherein a line spaced from said geometric axis defines lower and upper margins for the concentrating portion, from a point where said line is tangent to the parabolic defining the concentrating portion and parallel to the geometric axis for said parabola to a point where the line is tangent to the parabola and parallel to the optical axis for the concentrating portion a distance between said points projected from the optical axis defining the maximum height of the concentrating portion.

11. The concentrating solar receiver of claim 10 wherein said concentrating portion is truncated to a height of to about $\frac{1}{2}$ the maximum height as measured from the lower margin.

12. The concentrating solar receiver of claim 1 wherein said envelope comprises a vessel of relatively thin walled thermoplastic material having a wall thickness from about 0.05 to about 0.2 cm.

13. The concentrating solar receiver of claim 12 wherein said thermoplastic material is a glass composition.

14. The concentrating solar receiver of claim 12 wherein said reflector is deposited interior of said envelope on said concentrating portion.

15. The concentrating solar receiver of claim 1 wherein said envelope comprises a selectively formed light bulb enclosure.

16. The concentrating solar receiver of claim 1 wherein said conductive means includes an upstanding cylindrical portion attached about a periphery of said absorber means, said upstanding member having an inclined conical face arranged so as to reflect scattered radiation toward said absorber means in the vicinity of the focal zone.

17. The concentrating solar receiver of claim 1 including an insulating conduit and a pair of elongated electrically conductive heat sink means disposed therein each adapted to be coupled to at least one of the pins for each of the opposed faces of the absorber means for conducting electrical and thermal energy therefrom.

* * * * *